United States Patent
Hojczyk et al.

(10) Patent No.: US 6,191,073 B1
(45) Date of Patent: Feb. 20, 2001

(54) SERIES OF LAYERS AND COMPONENT CONTAINING SUCH

(75) Inventors: Ricardo Hojczyk, Aachen; Ulrich Poppe, Düren; Chunlin Jia, Jülich, all of (DE)

(73) Assignee: Forschungszentrum Julich GmbH, Julich (DE)

( * ) Notice: Under 35 U.S.C. 154(b), the term of this patent shall be extended for 0 days.

(21) Appl. No.: 09/254,167

(22) PCT Filed: Aug. 27, 1997

(86) PCT No.: PCT/DE97/01857

§ 371 Date: Feb. 27, 1999

§ 102(e) Date: Feb. 27, 1999

(87) PCT Pub. No.: WO98/09338

PCT Pub. Date: Mar. 5, 1998

(30) Foreign Application Priority Data

Aug. 27, 1996 (DE) .............................................. 196 34 463
Aug. 27, 1996 (DE) .............................................. 196 34 645

(51) Int. Cl.$^7$ ............................. H01B 12/02; H01L 39/22
(52) U.S. Cl. ......................... 505/238; 505/163; 505/190
(58) Field of Search ................................... 505/238, 239, 505/237, 163, 190

(56) References Cited

U.S. PATENT DOCUMENTS

| | | | |
|---|---|---|---|
| 5,378,683 | * | 1/1995 | Labanel et al. .................... 505/190 |
| 5,635,730 | * | 6/1997 | Sakakibara ............................. 257/34 |
| 5,696,392 | * | 12/1997 | Char et al. ........................... 257/190 |

FOREIGN PATENT DOCUMENTS 0 533 568 A1  3/1993  (EP) .

* cited by examiner

*Primary Examiner*—Mark Kopec
(74) *Attorney, Agent, or Firm*—Herbert Dubno

(57) ABSTRACT

The invention relates to a series of layers containing at least one layer on the basis of $REBa_2CU_3O_{7-z}$ or with a comparable crystallographic structure, wherein said layer is connected to a non-superconductive layer. The only material chosen for the non-superconductive layer is material containing atomic components which are chemically compatible with the superconductive material of the high temperature superconductive layer. Such a series of layers enables a multilayer system or also a cryogenic component, e.g. a Josephson contact, to be formed.

8 Claims, 8 Drawing Sheets

SERIES OF LAYERS AND COMPONENT CONTAINING SUCH

CROSS REFERENCE TO RELATED APPLICATIONS

This application is a national stage of PCT/DE97/01857 filed Aug. 27, 1997 and based in turn upon German national applications 196 34 463.8 and 196.34 645.2 both of Aug. 27, 1996 under the International Convention.

FIELD OF THE INVENTION

Our present invention relates to a layer sequence of the type in which at least one high temperature superconductor material is bonded to a nonsuperconductive layer, to a cryogenic component and multiple layer sequence characterized by the same.

The basis for components in superconductivity electronics is an epitactic multilayer system with at least one layer sequence in which the superconductive material forms boundary interfaces with nonsuperconductive materials. If the component is to be grown on a desired substrate a buffer layer can optionally be required.

BACKGROUND OF THE INVENTION

The following are known as state of the art:

1. Components of superconductivity electronics

Epitactic layer sequences or multilayer systems for such components are comprised of one or more thin films of a superconductive material and one or more thin films of nonsuperconductive material. These nonsuperconductive materials are effective as barrier materials in Josephson contacts or junctions, for passivation or as a diffusion block. Based on the characteristics of the high-temperature superconductor, the following are the requirements for the nonsuperconductors:

The high temperature superconductive and the nonsuperconductive materials must be chemically compatible. This means that no chemical reactions should occur between the materials. The nonsuperconductive material should be able to grow epitaxially on the high-temperature superconductive material and the high-temperature superconductive material should be correspondingly able to grow on the nonsuperconductive material with, indeed, the desired crystallographic orientation. The thus-resulting boundary interfaces should be atomically sharp and should not contain any defect-oriented regions or extraneous phases in their environs. Because of the relatively high fabrication temperatures of the layers, an interdiffusion of ions cannot be excluded and hence it must be ensured that any extraneous ions which are in the material affect the properties thereof to the smallest extent possible. It is, for example, known that above all small ions like those of Al, Ga, Ti, W, Fe, and Zn, or even Ce, Pr, reduce the superconductivity of the high-temperature superconductor $REBa_2CU_3O_{7-z}$ (RE=rare earth element).

This applies inter alia also to the oxygen content and the ordering of the oxygen atoms in the high-temperature superconductors in which the superconductivity is weakened by oxygen loss or oxygen disordering. A high degree of chemical compatibility is required when the nonsuperconductive material is used, for example, as thin barriers in Josephson junctions. Because of the reduced coherency lengths of high-temperature superconductors—typically in the range of 1 nm to 2 nm—it is required that the barrier material not have its coherency length, which is in the length range of the ordering parameter of the superconductive electrodes in the proximity of the boundary interface, reduced for example by ion diffusion or lattice dislocation. Up to now no material has been known which fulfills this requirement satisfactorily.

Materials research has been concentrated on two material classes. One class is oriented upon the structure of $REBa_2Cu_3O_{7-z}$. The research here is in targeted replacement and doping with one or more ion types which reduce the superconductive properties or even completely suppress them. The second class encompasses Perovskite or Perovskite-like compounds. From each class at an appropriate location, one material will be discussed.

The nonsuperconductive material $PrBa_2Cu_3O_{7-z}$ differs chemically from $YBa_2Cu_3O_{7-z}$ only by the substitution of Y by Pr which effects the loss of suuperconductivity. The lattice-defect match with $YBa_2Cu_3O_{7-z}$ amounts to only 1%. By comparison to most of the other, hitherto researched, nonsuperconductive materials, $PrBa_2Cu_3O_{7-z}$ has the highest degree of chemical and structural compatibility with $YBa_2Cu_3O_{7-z}$. For example, a monolayer of $YBa_2Cu_3O_{7-z}$ which serves as the intermediate layer in a $PrBa_2Cu_3O_{7-z}$ matrix, has a critical temperature $\{T_c\}$ of 30 K (T. Terashima et al, *Phys. Rev. Lett.* 67, 1362 (1991)).

Similar experiments with other nonsuperconductive materials show that these values cannot be attained with any other material. Substantial disadvantages of $PrBa_2Cu_3O_{7-z}$ are, however, its relatively low specific resistance, which makes it less than satisfactory for insulation purposes, and the reduction of the ordering parameter at the boundary interface as a result of diffusion of Pr ions into the $YBa_2Cu_3O_{7-z}$. If one replaces for example only 5% of the Y atoms in $YBa_2Cu_3O_{7-z}$ by Pr atoms, the critical temperature is already reduced from 92 K to 85 K (M. S. Hedge, et al., *Phys. Rev.* B 48, 6465 (1993)).

A typical representative of the second class of Perovskite-like compounds is $SrTiO_3$. This material has a cubic crystal structure whose lattice-defect matching to $YBa_2Cu_3O_{7-z}$ amounts to 1.2%. The specific resistance at 200 bMcm is clearly greater than that for $PrBa_2Cu_3O_{7-z}$. It shows that with this material a heteroepitaxy is possible with $YBa_2Cu_3O_{7-z}$. The chemical compatibility of the materials is, however, limited. The diffusion of Ti ions as well as their incorporation in the Cu sites of $YBa_2Cu_3O_{7-z}$ gives rise to a reduction of the ordering parameter in the vicinity of the boundary interface. Furthermore, the lattice distortion in the $YBa_2Cu_3O_{7-z}$ resulting from the boundary interface with the $SrTiO_3$, reduces the ordering parameter in a noticeable manner.

2. Buffer layers

Application-oriented requirements can make it desirable to grow high-temperature superconductor thin layers or a component containing such a layer on a substrate which is not suitable, e.g. from the aspect of chemical compatibility. Examples of this are the materials silicon and sapphire. Both react in an undesired manner chemically with the high-temperature superconductor $YBa_2Cu_3O_{7-z}$.

To form an epitaxy on these substrates, one or more so-called buffer layers are introduced which are disposed between the substrate and the thin layer/thin-layer system. Buffer layers are used to generate smoother surfaces of the high-temperature superconductor layer on certain substrates.

For $SrTiO_3$ buffer layers a so-called leveling effect is observed. That means that, when $SrTiO_3$ is grown on an atomic stage containing $YBa_2Cu_3O_{7-z}$ surfaces, it covers these surfaces and forms after several nm in thickness, a smooth [100] surface. This surface is then suitable for the c-axis-oriented growth of $YBa_2Cu_3O_{7-z}$. A buffer layer serves in general the purpose of improving certain characteristics of a thin layer on a given substrate.

The requirements as to the quality of buffer layers are comparable to those of the nonsuperconductive layers for components. It is conceivable to take into consideration certain drawbacks of a buffer layer. For instance a local reduction of the ordering parameter at the boundary interface between substrate at high temperature superconductor can be expected to a certain extent when the layer thickness of the superconductor is greater than, for example, 30 nm.

For silicon, for example, yttrium-stabilized zircon (YSZ) can be used as a buffer layer. The lattice-defect matching of YSZ is relatively high at up to 6%. The chemical compatibility is only limited. It has been observed that at the boundary interface $BaZrO_3$ develops which, as an extraneous phase, reduces the ordering parameter of the $YBa_2Cu_3O_{7-z}$. In addition, there is a diffusion of Zr to the Cu sites with the result that a reduced ordering parameter is communicated to the superconductor.

If $YBa_2Cu_3O_{7-z}$ is directly sputtered onto a sapphire substrate, $BaAl_2O_4$ can arise at the boundary interface and which highly interferes with the epitaxy of the $YBa_2Cu_3O_{7-z}$ growing thereon (K. Dovidenko, S. Oktyabrsky and A. Ivanov, *Mater. Si. Eng.* B 15, 25 (1992)). For sapphire substrates, $CeO_2$, inter alia, has been used as a buffer. In this case $CeO_2$ can grow in two different orientations (A.G. Zaitsev, R. Kutzner, R. Wdrdenweber, *Appl. Phys. Lett.* 67, 1 (1995)) which, as a consequence, is clearly detrimental to the epitaxy of the $YBa_2Cu_3O_{7-z}$ layer deposited on the $CeO_2$.

3. Substrate Materials

The use of materials as substrates for epitactic high-temperature superconductor thin films has as a precondition the ability to fabricate it as a macroscopic monocrystal. Further, for a sufficient quality, the substrate material in question must satisfy the following requirements:

chemical compatibility with the thin-layer material to be grown quality of the surface purity of the material homogeneity of the substrate thermodynamic stability low lattice-defect matching to the thin-layer low difference in the thermal coefficient of expansion.

Of these, the requirement for chemical compatibility has the highest priority, since most substrate materials contain ions which can be detrimental to a high-temperature superconductor upon interdiffusion therewith. An interdiffusion cannot, however, be excluded because of the relatively high fabrication temperature of the high-temperature superconductor. Thus known substrate materials like $SrTiO_3$, $LaAlO_3$ and MgO can contain ions like $Ti^{+4}$, $Al^{+3}$ and $Mg^{+2}$ which, in the superconductor, especially in $YBa_2Cu_3O_{7-z}$, substantially reduce the critical temperature.

In summary, the following problem fields have been discerned in which play a role in the three discussed use fields as superconductive components, as buffer layers, and as substrates.

All materials used hitherto in Josephson junctions as barriers show only a limited degree of chemical compatibility with the high-temperature superconductors whereby the obtained characteristics of the Josephson junction remain below what could theoretically be expected.

Furthermore, there are no known buffer materials upon which an ultrathin $YBa_2Cu_3O_{7-z}$ layer can be superconductively formed and whereby the buffer layer simultaneously forms an atomic stage with a leveling effect.

For the three planned fields named, materials have most frequently been used which are only limitedly chemically compatible with the high-temperature superconductors. This affects detrimentally the superconductive layers grown thereon, and whose superconductive characteristics, especially with reduced thickness of the superconductive layer, are degraded.

OBJECT OF THE INVENTION

It is thus the object of the invention to provide a layer sequence or a component with such a layer sequence, in which there is an improved chemical compatibility at the boundary interface between the superconductive and the nonsuperconductive layers. The ordering parameter of the superconductive layer, especially, should not be detrimentally affected by the bonding of the two layers.

SUMMARY OF THE INVENTION

These objects and others which will become apparent with a system in which the nonsuperconductive layer is a material from one of the classes:

(i) $BaTbO_3$ (ii) $Ba_{1-x}Sr_xTbO_3$ with $0 \leq x \leq 1$;

(iii) $LaCu_{1-x}Tb_xO_3$ with $0 \leq x \leq 1$;

(iv) $RCu_{1-x}Tb_xO_3$ with R=Nd, Eu, Sm and $0 \leq x \leq 1$;

(v) $R_{1-y}N_yCu_{1-x}Tb_xO_3$ with R=La, Nd, Eu, Sm; N=Ba, Sr and $0 \leq x \leq 1$ $0 \leq y \leq 1$, (vi) $R_{2-y}N_yCu_{1-x}Tb_xO_4$ with R=La, Nd, Eu, Sm; N=Ba, Sr and $0 \leq x \leq 1$ $0 \leq y \leq 2$;

(vii) $A^1_{1-x}A^2_xB^1_{1-y}B^2_yO_3$ with $A^1$=Ba, Sr; $A^2$=La, Nd, Eu, Sm, Sr
$B^1$=Tb, Cu;
$B^2$=Y, Yb, Tm, Lu, In, Sc, Sn, Cu.

The layer sequence according to the invention can be used for forming a barrier in Josephson junctions without thereby reducing the ordering parameter of the superconductive electrode at the boundary interface with the Josephson junction.

The layer sequence according to the invention is suitable for forming an ultrathin high-temperature superconductor or $REBa_2Cu_3O_{7-z}$ layer on a nonsuperconductive layer without reduction in the ordering parameter.

The layer sequence is also suitable for forming an epitactic superconductive component, advantageously while avoiding the reduction in the ordering parameter of the superconductor in the vicinity of the boundary layer between this nonsuperconductive material and the superconductive layer.

Finally, the layer sequence of the invention contains a nonsuperconductive layer which affords an improved leveling {planarizing} effect with respect to the high-temperature superconductive or $REBa_2Cu_3O_{7-z}$ layer growing thereon, without detriment to the ordering parameter.

In the sense of the invention, an ion or component can be chemically compatible if it fulfills the following condition: if 10% of an element in the high-temperature superconductor of the layer sequence is replaced by this ion type or component, the reduction in the critical temperature of the superconductive material does not exceed a value of 5 K.

The invention extends to components in the sense of an epitactic multi layer system on the buffer layer and on the substrate in the case of epitactical thin films of high temperature superconductor or other materials of like crystallographic structure. As representatives for the class of high temperature superconductor materials of the type: $YBa_2Cu_3O_{7-z}$ and $REBa_2Cu_3O_{7-z}$ where RE=Y, Ca, La, Pr, Nd, Sm, Eu, Gd, Tb, Dy, Ho, Er, Tm, Yb, Lu.

It is known that the solution of the problem of chemical compatibility of matters forms a principal criteria. As to that, oxidic nonsuperconductive materials can be used whose atomic types are chemically compatible with the superconductor, especially $REBa_2Cu_3O_{7-z}$. As chemically compatible elements for this purpose, Cu,Ba,Sr,Ca,Cu, as well as Y, La, Nd, Sn, Eu, Gd, Tb, Dy, Ho, Er, Tm, Yb, or Lu can be used.

The basis for a component for superconductor electronics is a epitactic multilayer system with at least one layer sequence and which the superconductive material forms boundary interfaces with the nonsuperconductive material. If the component is to be grown on a desired substrate, optionally a buffer layer can be required.

As state of the art, the following is known:

1. Components of superconductive electronics

Epitactic layer sequences or multilayer systems for such components are comprised of one or epitactic thin films of a high temperature superconductive material and one or more epitactic or nonsuperconductor thin materials. These nonsuperconductor materials can fulfill for example the function of an insulating layer, a barrier material in a Josephson junction, a passivation or a diffusion barrier. Depending upon the characteristics of the high temperature superconductor the following requirements can be established for these nonsuperconductive materials:

The nonsuperconductive material should be able to grow epitactically on the high temperature superconductor as well as allowing the high temperature superconductor to epitactically grow on the nonsuperconductive material and indeed the desired crystallographic orientation. The thus resulting boundary layer should be atomically sharp and of the boundary interface should not form in the region the defect orientation regions and foreign phases.

Different thermal coefficients of expansion should not lead to crack formation even with large layer thicknesses of the material and multiple charges through thermal cycles.

In components with epitactic multilayers in which the different layers between themselves or with respect to the substrate have different lattice constants, as much as possible there should be no offsetting or strong stresses or, nor should lattice defects of other types arise since these can negatively effect the function of the component. The lattice stresses which arise from lattice defect matching should in the ideal case be decomposed directly at the interface so that the layer region in the environs of the interface are as distortion free as possible.

2. Buffer Layers

Use in oriented requirements can make it necessary for the high temperature superconductor thin layer or the component containing such a layer, to be grown upon a substrate which is not suitable, for example, from the aspect of lattice defect matching.

Examples of this type are the materials silicon or sapphire. Both react in an undesired manner chemically with the high temperature superconductor $YBa_2Cu_3O_{7-z}$, they have in comparison to the latter a significant difference with respect to the thermal expansion coefficient and in the case of sapphire a high lattice defect matching in the range of 7 to 11%, depending upon the crystallographic direction considered. To enable an epitaxy on these substrates, one or more so-called buffer layers are used and which are arranged between the substrate and the thin layer/this layer system. The buffer provides a smoother and cleaner surface for the $YBa_2Cu_3O_{7-z}$ than the substrate.

Furthermore, the layer can act as a diffusion barrier. Especially for thin superconductor layers it is desirable that as little lattice distortion be present in the regions of the boundary surface of the superconductor. The buffer layer therefore serves the purpose of improving the properties of the superconductor thin layer or on a given substrate.

The requirements and the quality of buffer layers are comparable to those for nonsuperconductive layers for components. It can be foreseen that certain drawbacks of a buffer layer may have to be acceptable. For example, a local reduction in the ordering parameter at the boundary interface between substrate and high temperature superconductor may have to be acceptable when the layer thickness of the superconductor is greater than about 30nm.

For silicon, for example, yttrium stabilized zirconium (YSZ) is used as a buffer layer. The lattice defect match of (YSZ) is relatively large at up to 6%. Indeed, the critical temperature of 90 K for the $YBa_2Cu_3O_{7-z}$ can be obtained on YSZ but investigations of the microstructure of the c-axis-oriented thin layer region shows that it is defect oriented. The resulting weak contact can, for example, effect the current flow capabilities.

In the case of sapphire, $CeO_2$ is used as a buffer. It is often the case that $CeO_2$ will grow in two different orientations which can detrimentally effect the epitaxy of any $Yba_2Cu_3O_{7-z}$ layer deposited on the $CeO_2$, (A. G. Zaitsev et al., Appl. Phys. Lett. 67, 1 (1995)).

3. Substrate Materials

The use of materials as substrates for epitactic high temperature superconductor thin films requires principally the formation of a microscope monocrystal. The following are therefore specific requirements for a sufficient quality of the substrate materials which come into question:

small lattice defect match for thin film material;

quality of the surface;

purity of the material;

homogeneity of the substrate;

thermal dynamic stability;

reduced difference in the thermal coefficient of expansion; and chemical compatibility with the thin film material to be grown.

In summary the following problem fields can be recognized which more or less arise in each of the three discussed fields of use, superconductive components, buffer layers and substrates.

Extrinsic phases and a axis-oriented regions can also arise at an epitactic boundary interface between a nonsuperconductive material and a high temperature superconductor apart from lattice distortions and lattice stresses. These deviations from an ideal crystal structure of the superconductor are frequently not limited to a small region of the boundary interface, but negatively influence the superconductor over a relatively large extended region.

Furthermore, there can be in part a 45o rotation in the substrate plane on buffer layers and substrates with relatively large lattice defect matching with c-axis-oriented superconductor thin layers. These have been observed for example in the $YBa_2Cu_3O_{7-z}$ in those kind of thin layers on MgO and here gives rise to poor thin layer characteristics because of the resulting grain boundaries.

Further, the lattice defect matching and a difference in the thermal expansion coefficients between the high temperature superconductor and another material gives rise to further problem fields.

It is, therefore, a further object of the invention to provide a layer sequence or a component with such a sequence in which an improved lattice defect ordering free crystal structure is obtained at the boundary interface between the superconductor and the nonsuperconductive layer. Especially, the ordering parameter of the superconducting layer, upon bonding of both layers, should not be detrimentally influenced.

In this aspect of the invention the nonsuperconductive layer is the layer in one of the following classes:

(i) $BaTbO_3$
(ii) $Ba_{1-x}Sr_xTbO_3$ with $0 \leq x \leq 1$
(iii) $LaCu_{1-x}Tb_xO_3$ with $0 \leq x \leq 1$
(iv) $RCu_{1-x}Tb_xO_3$ with R=Nd, Eu, Sm and $0 \leq x \leq 1$;
(v) $Ba_{1-x}Sr_xMO_3$ with M=Tb, Pr, Ce and $0 \leq x \leq 1$;
(vi) $LaCu_{1-x}M_xO_3$ with Tb, Pr, Ce and $0 \leq x \leq 1$;
(vii) $RCu_{1-x}M_xO_3$ with R=Nd, Eu, Sm
   M=Tb, Pr, Ce and $0 \leq x \leq 1$;
(viii) $R_{1-y}N_yCu_{1-x}M_xO_3$ with R=La, Nd, Eu, Sm;
   N=Ba, Sr
   M=Tb, Pr, Ce and $0 \leq x \leq 1$ $0 \leq y \leq 1$;
(ix) $R_{2-y}N_yCu_{1-x}M_xO_4$ with R=La, Nd, Eu, Sm;
   N=Ba, Sr
   M=Tb, Pr, Ce and $0 \leq x \leq 1$ $0 \leq y \leq 1$;
(x) $A^1_{1-x}A^2_xB^1_{1-y}B^2_yO_3$
   with $A^1$=Ba, Sr;
   $A^2$=La, Nd, Eu, Sm, Sr
   $B^1$=Tb, Pr, Ce, Cu;
   $B^2$=Y, Yb, Tm, Lu, In, Sc, Sn, Cu
   and $0 \leq x \leq 1$ $0 \leq y \leq 1$.

The layer sequence according to the invention can be used to form a boundary layer which has practically no stresses in the high temperature superconductor nor in the nonsuperconducting layer bounding adjacent same.

The layer sequence according to the invention is thus suitable since no extensive misfit dislocations arise at the boundary interface between the two materials.

Thus the layer sequence according to the invention can be used to form an epitactic superconducting component, advantageously avoiding on the one hand an a-axis-oriented growth into the high temperature superconductive layer and on the other hand, in the case of c-axis-oriented growth of the high temperature superconductor thin layer a-axis-oriented regions at the boundary interface in nucleated form can be excluded.

Furthermore, the layer sequence according to the invention is satisfactory since with buffer layers or substrates with larger lattice defect matching, like MgO, no grain boundaries arise in the superconductor layer which lie at a 45° rotation in the layer plane in partial regions of a c-axis oriented high temperature superconductor thin layer.

Finally, the layer sequence according to the invention can level out a possible difference of the thermal expansion coefficient of the high temperature superconductor and another material and a possible lattice defect match between the high temperature superconductor and another material.

The invention extends to components in the sense of an epitactic multilayer system in which epitactic thin layers of high temperature superconductor or materials with similar crystallographic structure are deposited on the buffer layer and on the substrate. Representatives from the high temperature superconductor class are those materials like $YBa_2Cu_3O_{7-z}$ and $REBa_2Cu_3O_{7-z}$ wherein RE=Y, Ca, La, Pr, Nd, Sm, Eu, Gd, Tb, Dy, Ho, Er, Tm, Yb, Lu.

The invention according to claims 1 to 19 is further elucidated in connection with the Figures and Examples. It shows:

BRIEF DESCRIPTION OF THE DRAWING

The above and other objects, features, and advantages will become more readily apparent from the following description reference being made to the accompanying drawing in which.

SPECIFIC DESCRIPTION

First Example

Figure 1:
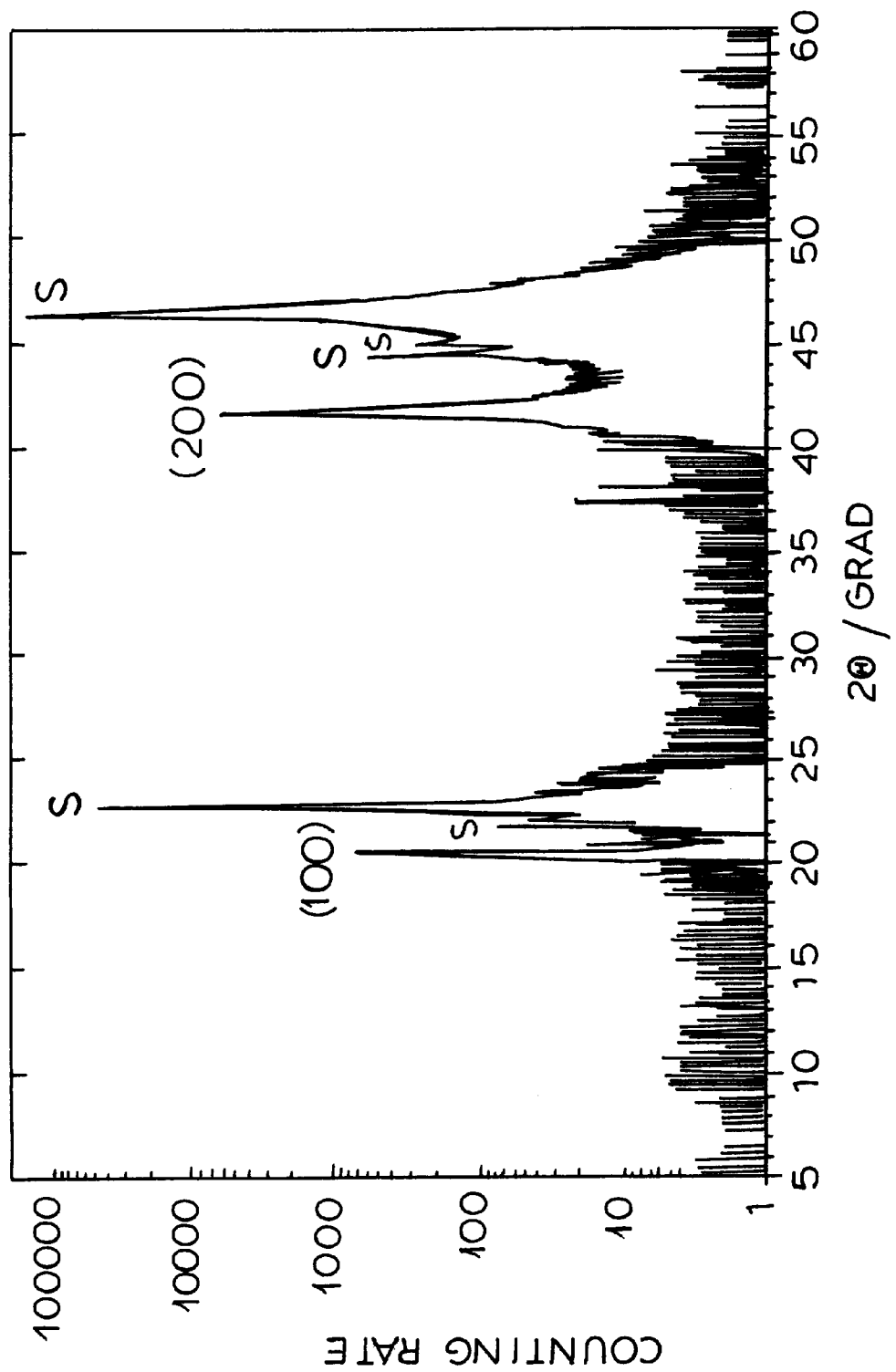
FIG. 1 is an X-ray defractogram of a layer sequence according to the invention.

In FIG. 1, an x-ray defractogram of a 120 nm thick $BaTbO_3$ layer on a (100)-orientation $SrTiO_3$ substrate has been shown. The measurements used are those of the so-called Bragg-Bretano geometry. Apart from the substrate reflection indicated at "S", the (100)- and the (200)- reflections of the $BaTbO_3$ are distinguishable. In the measurement angle range of 2 $\Theta$=5° through 2 $\Theta$=60° there are no further reflections observable which interalia can provide an indication of extraneous phases.

Figure 2:
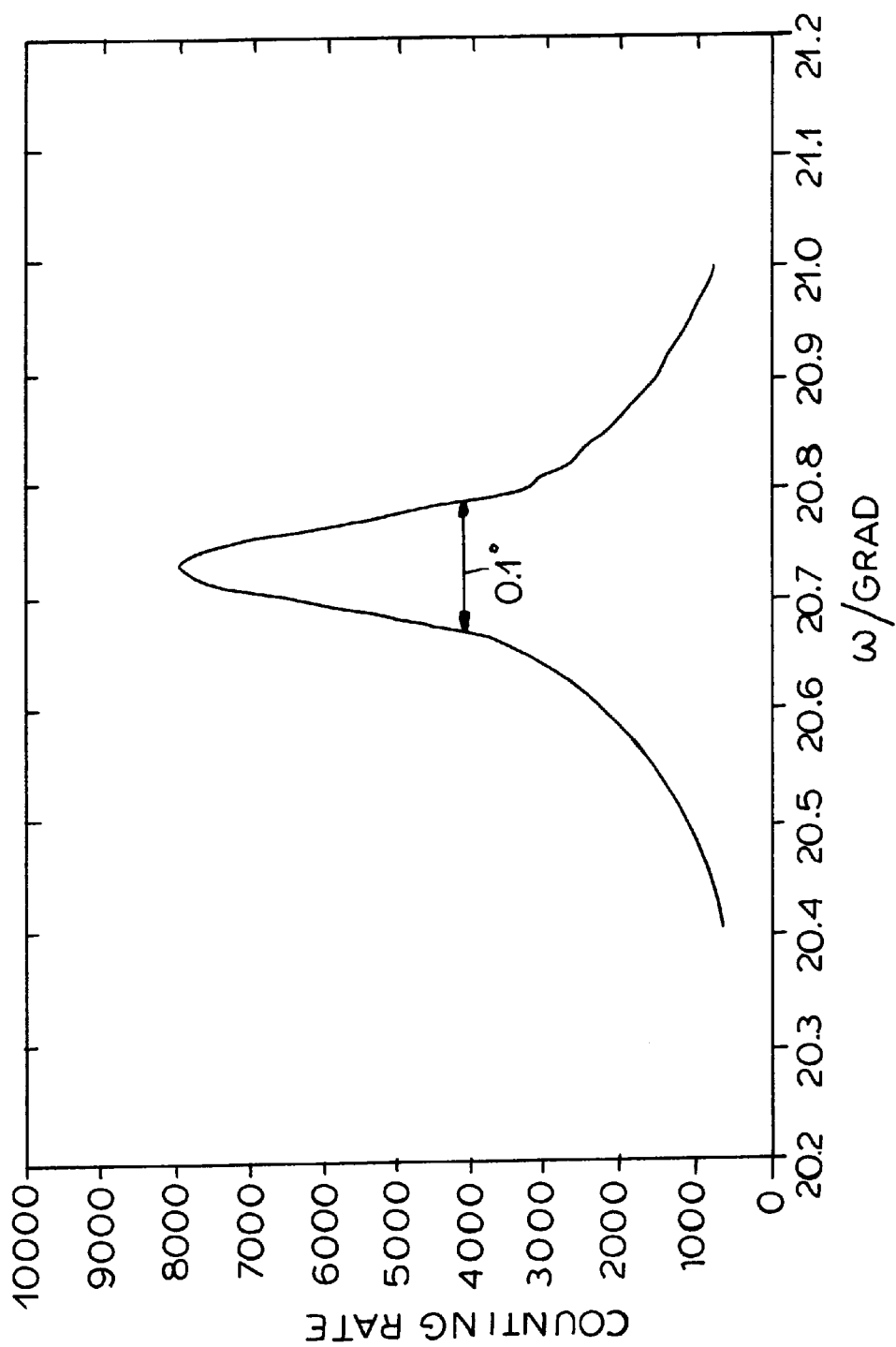
FIG. 2 is a rocking curve in the region of a nonsuperconductive layer according to the layer sequence of the invention.

The half value width of the rocking curve in FIG. 2, a so-called X scan, amounts to only 0.1°, measured at the (200) reflexes which indicates a slight angular tilting of the network plane.

Figure 3:
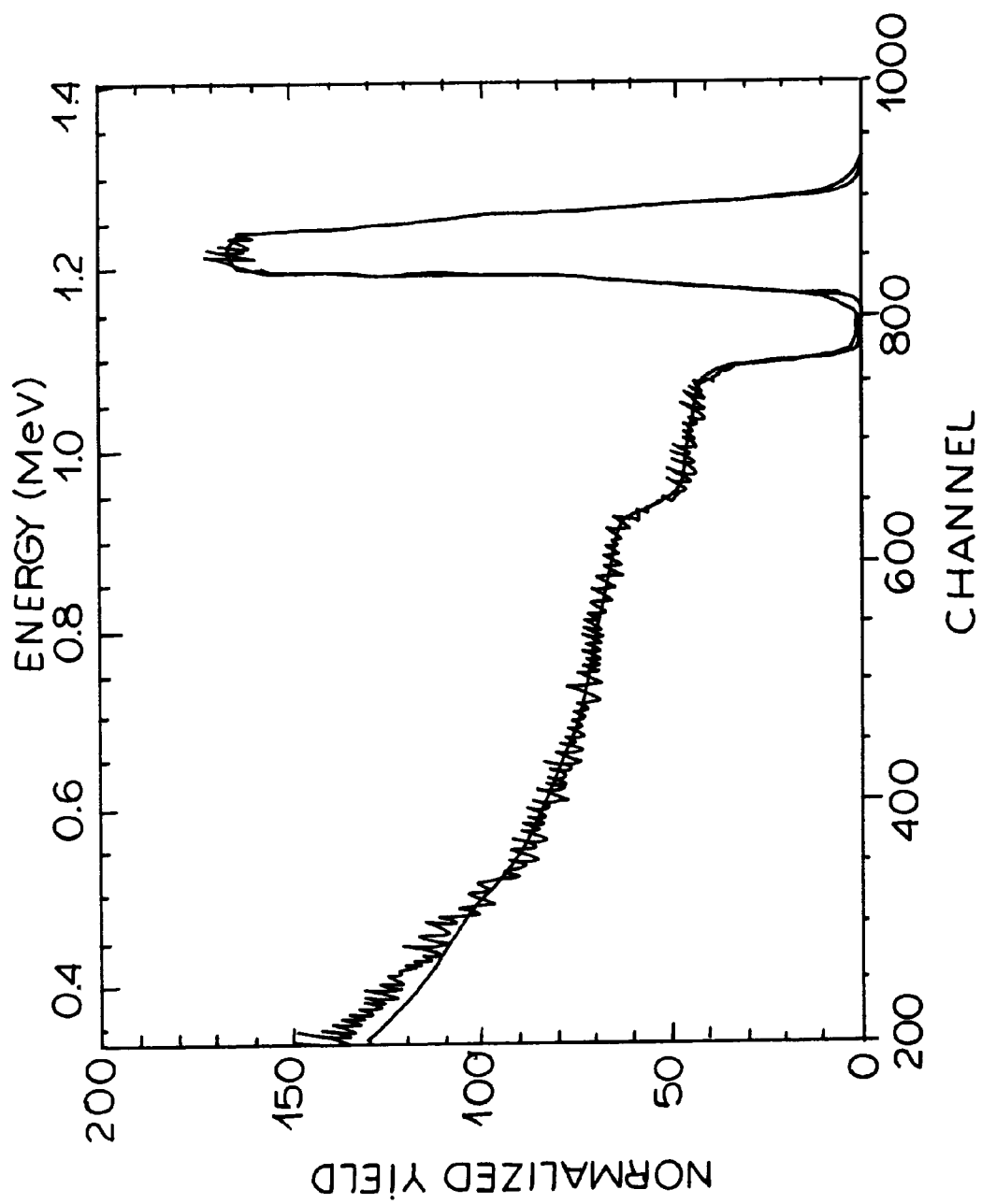
FIG. 3 is a diagram of a Rutherford back scattering spectrum (RBS) in the region of a nonsuperconductive layer of a layer sequence according to the invention.
Figure 4:
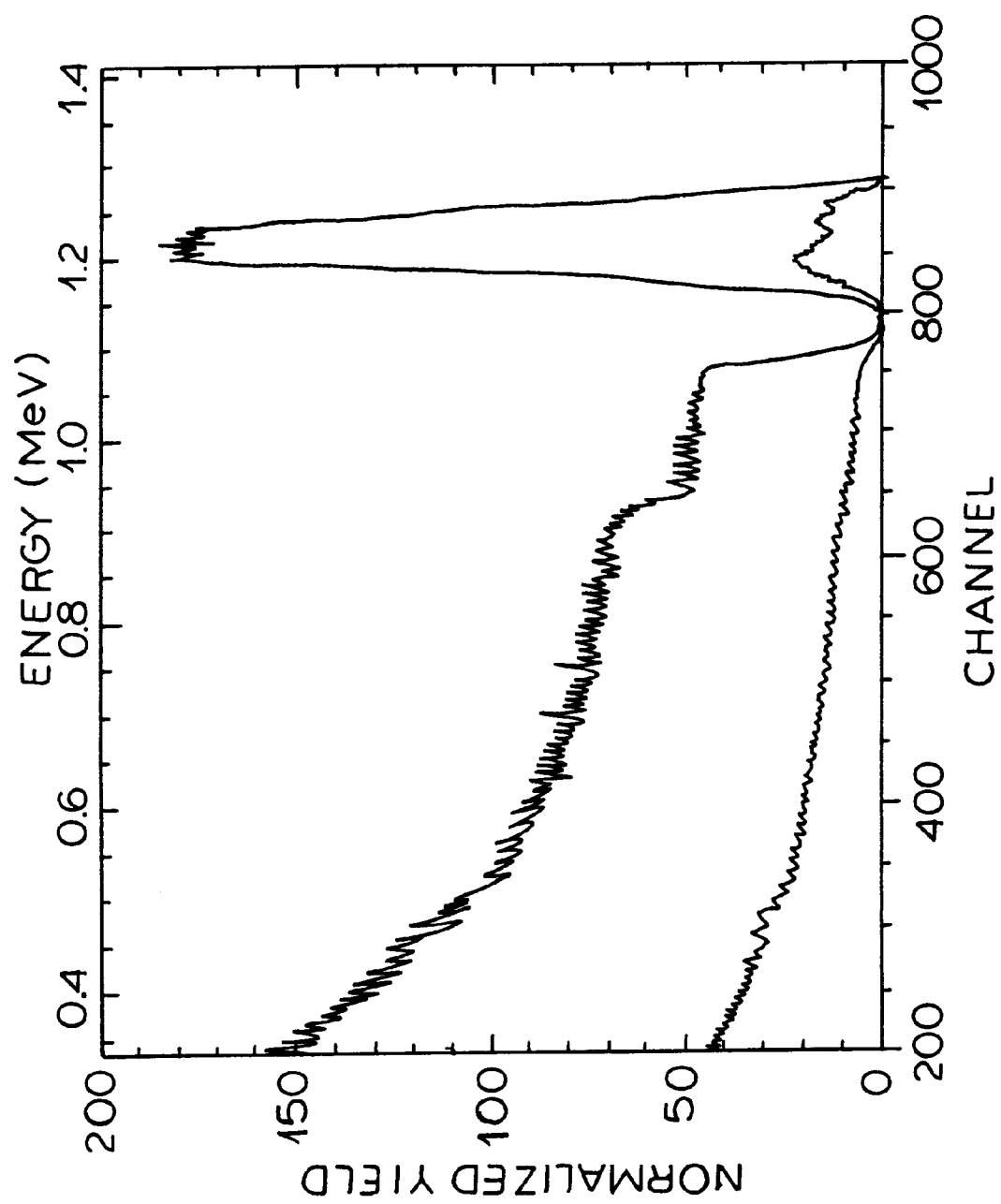
FIG. 4 shows the random (upper) and channelling (lower) measurement of the RBS analysis in the region of the nonsuperconductive layer of a layer sequence according to the invention.

The result of the RBS investigation has been shown in FIG. 3. Based upon the superimposition of the measurement curve and the simulation (continuous line), the correct cation ratio can be determined. The channeling measurement, shown in FIG. 4, gives an effective minimum yield value of only 7%.

Figure 5A:
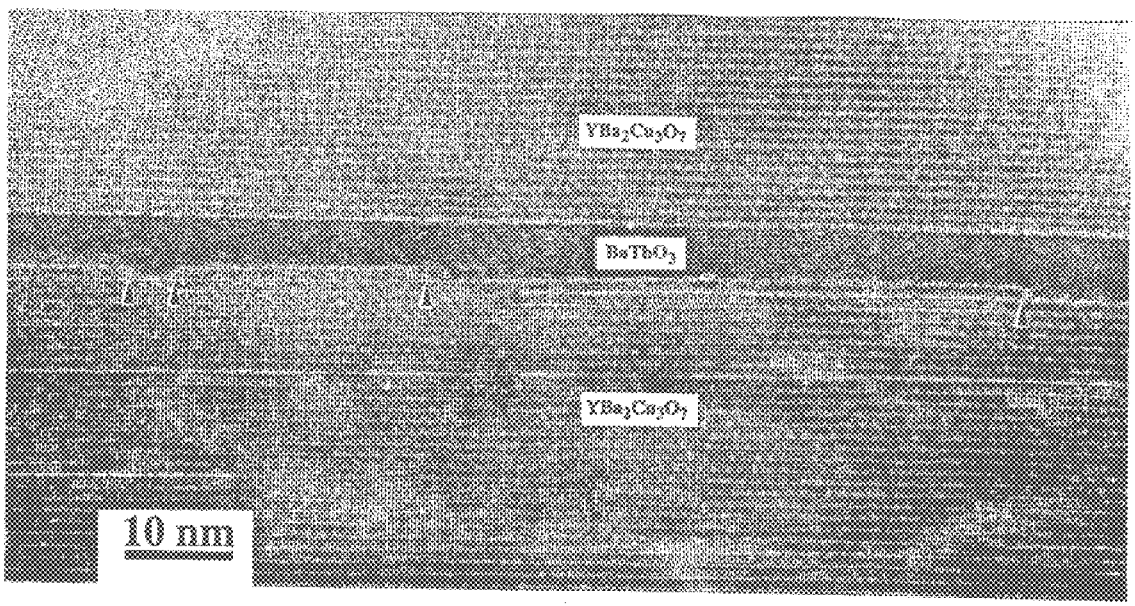
FIG. 5a is a TEM-image of a layer sequence according to the invention.

In FIG. 5a, a TEM image has been shown to clarify the heterostructure. The investigation by transmission electron microscopy (TEM) is based upon such a thin layer sequence with a heterostructure fabricated according to the invention on an $SrTiO_3$ substrate and comprised of the following layers:

| Layer 1 | 35 nm $YBa_2Cu_3O_{7-z}$ |
| Layer 2 | 12 nm $BaTbO_3$ |
| Layer 3 | 35 nm $YBa_2Cu_3O_{7-z}$ |

In the TEM-investigation of such a layer sequence according to the invention, the following results were obtained:

An epitactic growth of all layers was established whereby the $YBa_2Cu_3O_{7-z}$ advantageously was exclusively c-axis-oriented and the $BaTbO_3$ was grown only with (100) orientation. A heteroepitaxial layer sequence of $BaTbO_3$ with the $YBba_2Cu_3O_{7-z}$ was experimentally shown. The boundary interfaces were free from extraneous phases or defect oriented regions and especially a-axis growth was suppressed.

Figure 5B:
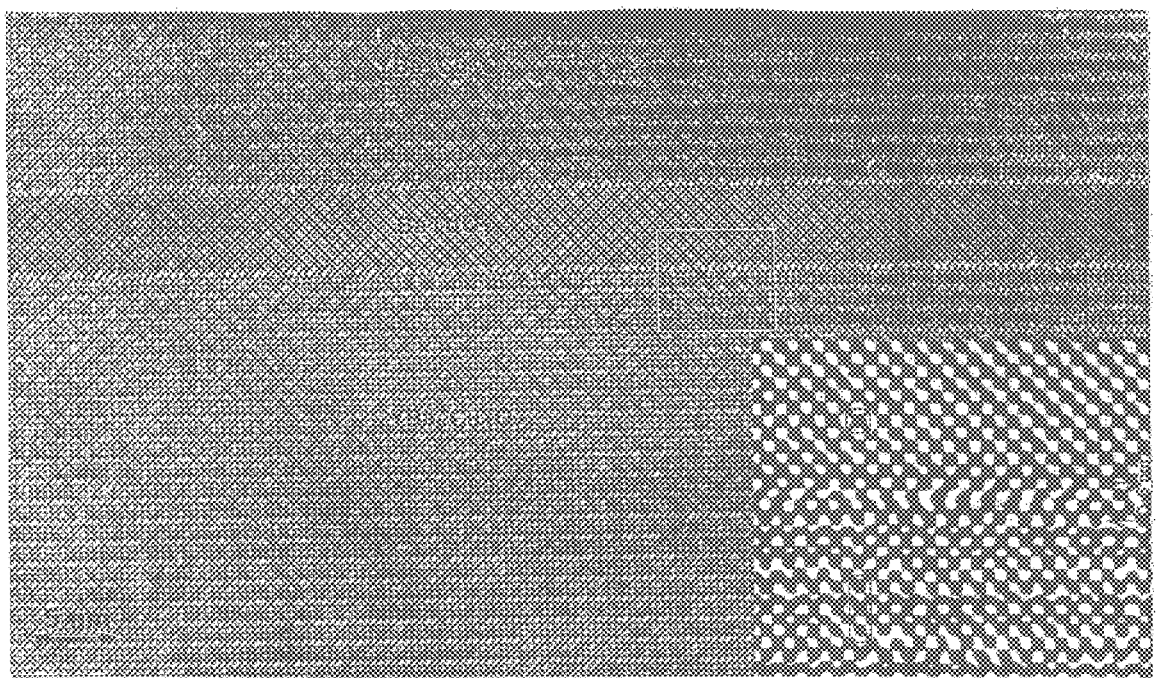
FIG. 5b is a TEM-image of a layer sequence according to the invention.

A typical boundary interface of such a structure is shown in FIG. 5b. Like with $SrTiO_3$, $BaTbO_3$ has the capability to level out nonuniformities of a $YBa_2Cu_3O_{7-z}$ surface. That means that if $BaTbO_3$ is grown on a $YBa_2Cu_3O_{7-z}$ surface which contains steps, it covers these and forms after several nm of thickness advantageously a smooth (100) surface on which the $YBa_2Cu_3O_{7-z}$ grows with c-axis-orientation. It has been concluded from this that low indexed areas of the $BaTbO_3$ lattice structure have a reduced surface energy and thus show the preferred boundary interfaces.

Especially $BaTbO_3$ has a planarizing effect with relation to the raw epitactic underlayers and provides for the $Yba_2Cu_3O_{7-z}$ to be deposited thereon, an advantageously smooth surface. As the material for the nonsuperconductive layer in the layer sequence, especially the highly suitable Perovskitic compound $Ba_{1-x}Sr_xTbO_3$ is proposed, whereby the value x can be selected in the range of 0 to 1. The romboidic crystal structure of this compound can be treated like the pseudo cubic Perovskite structure because of its limited deviation from a cubic structure. This material is indeed known (E. Paletta, R. Hoppe, Naturwissenschaften 53, 611 (1966) and A. J. Jacobson, B. C. Tofield, B. E. F. Fender, Acta, Cryst. B28, 956 (1972)). In the literature, however, up to now only the production of powder specimens has been described. Thin layers and macroscopic monocrystals of this material are not, however, known hereto. Advantageously this compound has thermodynamically a comparatively high stability.

The chemical compatibility with the high temperature superconductor is given from the view point of the elements contained in the compound since on the one hand Ba and O are found in the $REBa_2Cu_3O_{7-z}$ compounds while on the other hand Tb can be used to dope the Re compound in amounts up to 40% without dropping the critical temperature noticeably (by less than 1 K). Finally, Sr can be doped into the Re compound without markedly reducing the transition temperature; thus as 60% of the Ba atoms are replaced by Sr atoms, the $T_c$ is reduced only by 8 K.

Within the series of the rare earths (RE), Tb has a special position since it can be incorporated in the octahedric oxygen environment in Perovskite also as a tetravalent relatively small ion, without the pair-breaking characteristics or doping effect as in the case of Pr or Ce, which disadvantageously reduces the superconductivity.

Epitactic $BaTbO_3$ thin layers can be made on $SrTiO_3$ and MgO substrates by Rf sputtering pure oxygen (U. Poppe et al., Solid State Comm. 66, 661 (1988)) at a pressure in the range of 2 to 4 mbar to yield structures which can be investigated by x-ray defractometry, RBS/Channeling with He-ions and transmission electron microscopy.

In addition, the following should be noted with respect to the use of desirable characteristics of the layer sequence according to the invention and the components according to the invention:

Lattice stresses are locally suppressed at the boundary interfaces without the introduction of extensive misfit defects. Extraneous phases and defect oriented regions are not observed at the boundary interface. For the $YBa_2Cu_3O_{7-z}$, no a-axis growth is observed. From the literature, it is known that polycrystalline massive specimens of $BaTbO_3$ are electrically insulating. The $BaTbO_3$ layers epitactically produced according to the invention have also been found to be insulating.

Because of the number of materials which are closely compatible with $BaTbO_3$ chemically us to the high temperature superconductors and the number of materials with similar crystallographic structures to the high temperature superconductivity and materials with similar crystal structure, the invention extends also to the following materials (i) $BaTbO_3$ (ii) $Ba_{1-x}Sr_xTbO_3$ with $0 \leq x \leq 1$ (iii) $LaCu_{1-x}Tb_xO_3$ with $0 \leq x \leq 1$ (iv) $RCu_{1-x}Tb_xO_3$ with R=Nd, Eu, Sm and $0 \leq x \leq 1$;

(v) $R_{1-y}N_yCu_{1-x}Tb_xO_3$ with R=La, Nd, Eu, Sm; N=Ba, Sr and $0 \leq x \leq 1$ $0 \leq y \leq 1$;

(vi) $R_{2-y}N_yCu_{1-x}Tb_xO_4$ with R=La, Nd, Eu, Sm; N=Ba, Sr and $0 \leq x \leq 1$ $0 \leq y \leq 2$;

(vii) $A^1_{1-x}A^2_xB^1_{1-y}B^2_{1-y}O_3$ with $0 \leq x \leq 1$ $0 \leq y \leq 1$;
  with $A^1$=Ba, Sr;
  $A^2$=La, Nd, Eu, Sm, Sr
  $B^1$=Tb, Cu;
  $B^2$=Y, Yb, Tm, Ly, In, Sc, Sn, Cu Materials which are Chemically Compatible with the high temperature superconductors should especially be the mentioned materials and material classes with Perovskite like structures.

The term "high temperature superconductor and materials with similar crystallographic structure" means substances with at least three different elements in the unit cell, two of which are oxygen and copper. Further, the unit cell should include at least one $CuO_2$ plane which is characteristic of the high temperature superconductor.

The protection is intended to encompass also $REBa_2Cu_3O_{7-z}$ compounds wherein RE=Y, Ca, La, Pr, Nd, Sm, Eu, Gd, Tb, Dy, Ho, Er, Tm, Yb, Lu.

Second Example

In FIG. 1, an x-ray defractogram for a 120 nm thick $BaTbO_3$ layer on a (100)-oriented $SrTiO_3$ substrate is shown. The measurements used are those of the so-called Bragg-Bretano geometry.

Apart from the substrate reflexes indicated at "S",, the (100) - and the (200)-reflexes of the $BaTbO_3$ are clearly recognizable.

In the measured angle range of $2\theta=5°$ through $2\Theta=60°$ there are no further reflexes which can be interalia those of foreign phases, observable.

The half value width of the Rocking curve in FIG. 2, a so-called ω scan, amounts to only 0.1°, measured at the (200) reflex which is associated with a small angular tilting of the network planes.

The result of the RBS investigation has been shown in FIG. 3. Based upon the superimposition of the measurement curve and the simulation (continuous line), the correct cation ratio can be determined. The channeling measurement, shown in FIG. 4, gives an effective minimum yield value of only 7%.

Figure 6A:
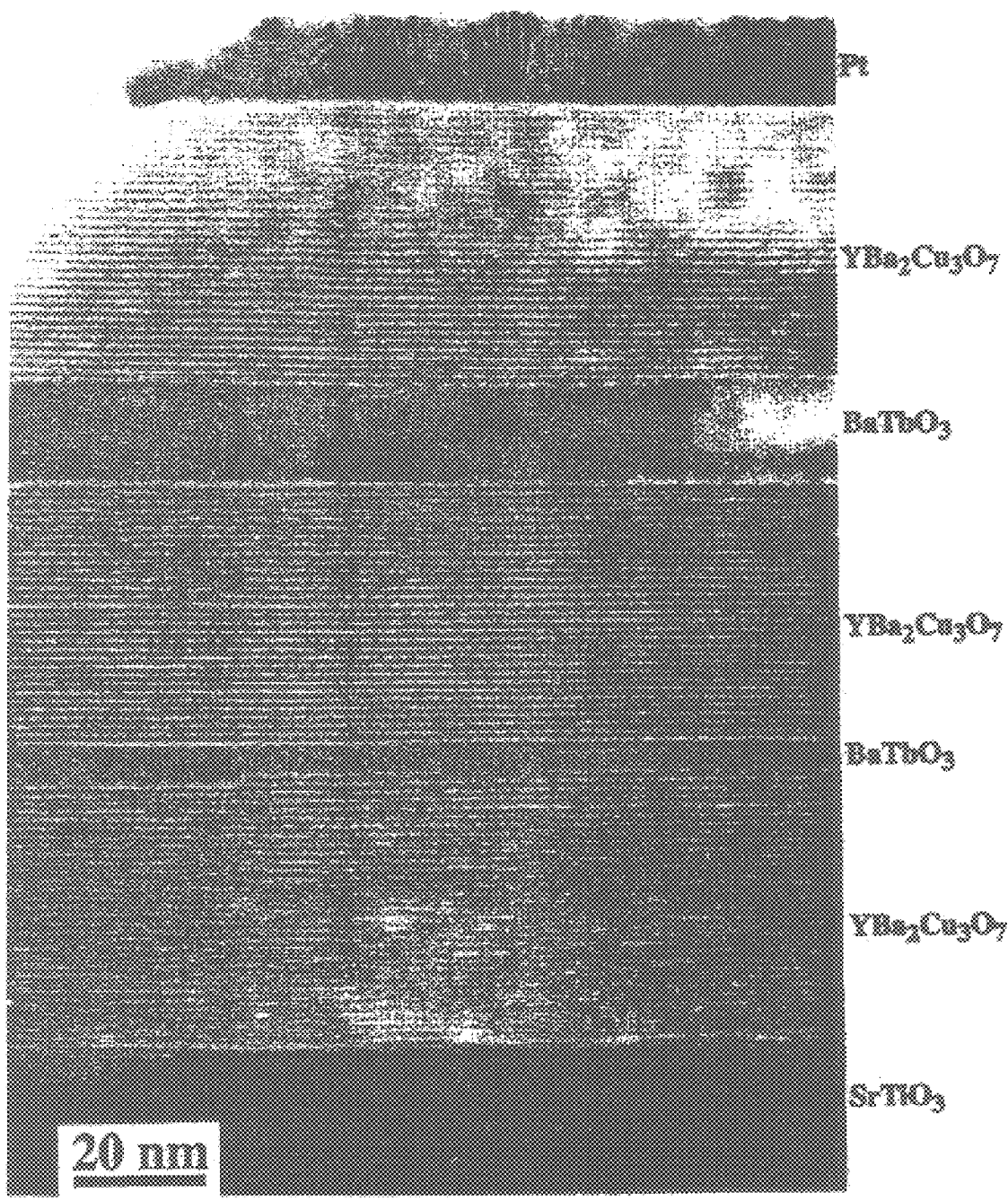
FIG. 6a is a TEM-image of a layer sequence according to the invention.

In FIG. 6a, a TEM image of the heterostructure. For the investigation by means of transmission electron microscopy (TEM), there is shown a thin heterostructure layer sequence according to the invention produced on an $SrTiO_3$ substrate and which is comprised of the following layers:

| Layer 1 | 35 nm $YBa_2Cu_3O_{7-z}$ |
|---------|---------------------------|
| Layer 2 | 4–5 nm $BaTbO_3$ |
| Layer 3 | 35 nm $YBa_2Cu_3O_{7-z}$ |
| Layer 4 | 12 nm $BaTbO_3$ |
| Layer 5 | 35 nm $YBa_2Cu_3O_{7-z}$ |

The following is also an outgrowth of the TEM investigation of such a layer sequence according to the invention:

An epitactic growth of all growth is established, whereby the $YBa_2Cu_3O_{7-z}$ grows advantageously exclusively with a c-axis-orientation and the $BaTbO_3$ only with (100) orientation. The result is an experimentally demonstrated heteroepitactic layer sequence with $BaTbO_3$ and the $YBa_2Cu_3O_{7-z}$.

At the boundary interfaces, there are no extrinsic phases and no defect oriented regions. Especially no a-axis growth and no regions rotated by 45° in the layer plane are observed. Because of the 10% lattice defect matching of $BaTbO_3$ to the $YBa_2Cu_3O_{7-z}$, it is probable that, as with MgO with a similarly high lattice defect matching, large angle grain limits with regions rotated by 45° in the layer plane and strong dislocations of the lattice in the regions of a higher dense crosslinking can arise. This, however, has not been observed as the results of FIG. 6b show.

Figure 6B:
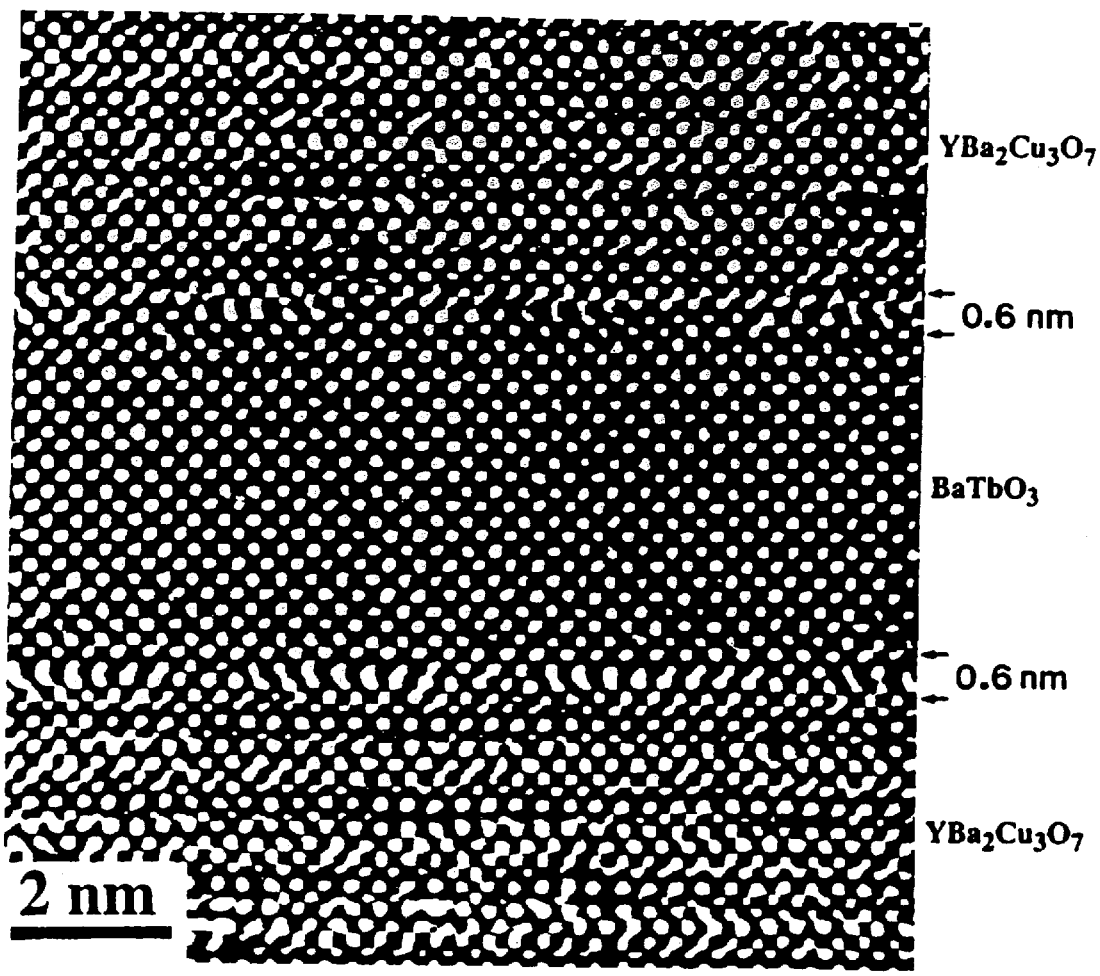
FIG. 6b is a TEM-image of a layer sequence according to the invention.

Between the respective $BaTbO_3$ and $YBa_2Cu_3O_{7-z}$ layer there is practically an atomically sharp 6 Å thick intermediate layer with a non-commensurable structure in which the atomic spacings are variable and thus stresses of the lattice defect matching are substantially localized and eliminated at the boundary interface (FIG. 6b).

This intermediate layer probably is comprised of an oxygen deficient double layer in which cations of variable valents like $Tb^{+3/+4}$ and $Cu^{+1/+2/+3}$ are distributed. In this connection, it has been found that in the layer sequence of the invention neither in the $BaTbO_3$ layer nor in the $Yba_2Cu_3O_{7-z}$ layer do noticeable lattice defects arise at a spacing from the boundary layer of less than 1 nm (FIG. 6b).

Because of the incorporation of the intermediate layer and variations of the atomic spacing in the layer sequence, the lattice stresses which arise by the combination of the $YBa_2Cu_3O_{7-z}$ with $BaTbO_3$ are eliminated.

As a consequence, it is not required to reduce the oxygen conduct in the vicinity of the boundary interface to eliminate lattice stresses.

As the material for the nonsuperconductive layer in the layer sequence, there is proposed especially the highly suitable Perovskitic compound $Ba_{1-x}Sr_xTbO_3$ whereby the value x is selected in the range of 0 to 1. The romboidic crystal structure of this compound can be treated like the pseudo-cubic Perovskite structure because of its limited deviation from a cubic structure. This material is indeed known (E. Paletta, R. Hoppe, Naturwissenschaften 53, 611 (1966) and A. J. Jacobson, B. C. Tofield, B. E. F. Fender, Acta, Cryst. B28, 956 (1972)). In the literature, however, up to now only the production of powder specimens has been described. Thin layers and macroscopic monocrystals of this material have not, however, been known heretofore. Advantageously this compound has thermodynamically a comparatively high stability.

With the layer sequence according to the invention it is found that in spite of the large lattice defect matching of 10%, the microstructure of the $YBa_2Cu_3O_{7-z}$ thin layers which are grown on the $BaTbO_3$ are not distorted by lattice defects, extensive misfit dislocations, the growth of extraneous phases, the growth of a-axis crystals or by crack formation. These results significantly on the characteristics of the $BaTbO_3$ whose boundary interfaces to the high temperature superconductor from the above described intermediate layer, since this intermediate layer contributes substantially to the elimination of the lattice stresses and in this manner prevents lattice disruptions in the superconductor.

It has been found that, with respect to the characteristics of the intermediate layer, it is advantageous that Tb ions and/or Cu ions are involved and by means of their variable valence, the oxygen content and thus the lattice spacings in the intermediate layer are variable. Other Porovskites can also be considered whose ions have variable valences for the formation of such an intermediate layer at the boundary interface.

Since the $BaTbO_3$ materially is extremely expensive, especially $BaPrO_3$ and $BaCeO_3$ can be mentioned since Pr and Ce, like Tb, can be trivalent or tetravalent. A slight limitation as to $BaCeO_3$ as such a material arises since the $Ce^{+4}$ is substantially more stable than $Ce^{+3}$ and thus the variability of the valence of the Ce ion is more strongly limited than is the case for the Pr and the Tb.

Under the supposition Tb and Cu ions of varible valence are incorporated in the intermediate layer, other Porovskite like compounds can be considered, which contain Cu, Tb, Pr or Ce ions, in combination with materials which include at least one $CuO_2$ plane in the unit cell, for the formation of the above described intermediate layer as a boundary interface layer.

Based upon chemical compatibility, $BaCeO_3$ and $BaPrO_3$ are indeed less suitable candidates for barrier materials in Josephson junctions since Pr and Ce ions reduce the critical temperature of the high temperature superconductor. However, these materials are appropriate for example for use in the formation of a buffer layer. Based upon the above described structure of the intermediate layer, the chemical binding forces in this layer is weaker by comparison to those on each side of the boundary interface. In this way, it is possible to suppress lattice stresses on each side of the boundary interface even at low temperatures.

The above mentioned results demonstrate further that $BaTbO_3$ not only can be integrated in an epitactic multilayer system but also can be used as a barrier material in Josephson junctions.

Up to now no material other than $BaTbO_3$ with a Porovskite structure has been known which, when included in a heterostructure with the microstructure of the $YBa_2Cu_3O_{7-z}$ does not at the boundary interface, form lattice dislocations, extensive misfit upsetting, extraneous phases, local a-axis growth, crack formation or large angle grain boundaries, characterized by a 45° rotation of the layer regions in the layer plane.

Only over a region limited to less than 1 nm in thickness is a slight lattice disruption observable in the superconductor directly above the aforedescribed intermediate layer.

Its use as a buffer material on substrates, especially in combination with high temperature thin layers, is thus especially suitable. The following considerations should be noted:

$BaTbO_3$ can be used as a buffer layer on chemically noncompatible substrates to act as a diffusion barrier against substrate ions detrimental to the superconductivity. Furthermore, its use as a buffer layer on substrates which have a lattice defect match to the high temperature superconductor like, for example, Mgo or $Al_2O_3$, is also possible to avoid undesired stress in the thin films to be grown. In addition its use is also possible, as a buffer layer on substrates, like for example silicon, whose thermal expansion coefficient deviates sharply from that of the thin film to be grown. Such substrates, without a buffer layer, normally give rise to crack formation in thin films.

An epitactic heterosystem comprised of $BaTbO_3$/$YBa_2Cu_3O_{7-z}$ can also be used when two optional materials are to be connectable which cannot be directly epitactically bonded or can be epitactically bonded only with severe distortion of the microstructure, by introducing a buffer layer. Because of the simple chemical composition and the high thermodynamic stability of the compound, it is possible to produce macroscopic substrate monocrystals.

Epitactic $BaTbO_3$ thin layers can be produced on $SrTiO_3$ and Mgo substrates by RF sputtering in pure oxygen at a pressure in the range of 2 to 4 mbar and these structures can be explored by means of x-ray defractometry, RBS/channeling with He ions and transmission electron microscopy.

Apart from this, the following characteristics which are useful for applications of the layer sequence according to the invention and the components according to the invention have been observed:

In the case of a rough underlay, $BaTbO_3$ has a planarizing [levelling] effect. $BaTbO_3$ advantageously only contains elements which are compatible with high temperature superconductors. From the literature it has only been indicated initially that polycrystalline massive samples of $BaTbO_3$ are electrically insulating. The epitactic $BaTbO_3$ thin layers are likewise insulating.

Because the number of materials which $BaTbO_3$ represents as an improved crystal structure at the interface with high temperature superconductors from a narrow group and the number of materials for high temperature superconductors or materials with similar crystallographic structure to which they are applicable can be defined, the invention includes also to the following materials:

(i) $BaTbO_3$;

(ii) $Ba_{1-x}Sr_xTbO_3$ with $0 \leq x \leq 1$;

(iii) $LaCu_{1-x}Tb_xO_3$ with $0 \leq x \leq 1$;

(iv) $RCu_{1-x}Tb_xO_3$ with R=Nd, Eu, Sm and $0 \leq x \leq 1$;

(v) $Ba_{1-x}Sr_xMO_3$ with M=Tb, Pr, Ce and $0 \leq x \leq 1$;

(vi) $LaCu_{1-x}M_xO_3$ with Tb, Pr, Ce and $0 \leq x \leq 1$;

(vii) $RCu_{1-x}M_xO_3$ with R=Nd, Eu, Sm
  M=Tb, Pr, Ce and $0 \leq x \leq 1$;

(viii) $R_{1-y}N_yCu_{1-x}M_xO_3$ with R=La, Nd, Eu, Sm;
  N=Ba, Sr
  M=Tb, Pr, Ce and $0 \leq x \leq 1$ $0 \leq y \leq 1$;

(ix) $R_{2-y}N_yCu_{1-x}M_xO_4$ with R=La, Nd, Eu, Sm;
  N=Ba, Sr
  M=Tb, Pr, Ce and $0 \leq x \leq 1$ $0 \leq y \leq 1$;

(x) $A^1_{1-x}A^2_xB^1_{1-y}B^2_yO_3$
  with $A^1$=Ba, Sr;
    $A^2$=La, Nd, Eu, Sm, Sr
    $B^1$=Tb, Pr, Ce, Cu;
    $B^2$=Y, Yb, Tm, Lu, In, Sc, Sn, Cu
      and $0 \leq x \leq 1$ $0 \leq y \leq 1$ Materials which are chemically compatible with the high temperature superconductors should especially be the mentioned materials and material classes with Perovskite like structures.

The term "high temperature superconductor and materials with similar crystallographic structure" means substances with at least three different elements in the units cell, two of which are oxygen and copper. Further, the unit cells should include at least one $CuO_2$ plane which is characteristic of the high temperature superconductor.

The protection is intended to encompass also $REBa_2Cu_3O_{7-z}$ compounds wherein RE=Y. Ca, La, Pr, Nd, Sm, Eu, Gd, Tb, Dy, Ho, Er, Tm, Yb, Lu.

What is claimed is:

1. A layer sequence comprised of at least one layer of a high temperature superconductor material basis with at least one unit cell having a $CuO_2$ plane, whereby this layer is bonded to a nonsuperconductive layer consisting of $Ba_{1-x}Sr_xTbO_3$ with $0 \leq x \leq 1$.

2. A layer sequence according to claim 1 wherein the nonsuperconductive layer forms a buffer layer between the high temperature superconductive layer and a substrate.

3. A layer sequence according to claim 1 wherein the nonsuperconductive layer is formed as a substrate.

4. A multilayer system with a plurality of layer sequences according to claim 1.

5. A cryogenic component with at least one multilayer system according to claim 4.

6. A cryogenic component with at least one layer sequence according to claim 1.

7. A Josephson juncton as a cryogenic component according to claim 6.

8. A cryogenic component according to claim 6, for compensating a lattice defect match between a high temperature superconductor and another optional material.

* * * * *